(12) United States Patent
Britz et al.

(10) Patent No.: US 11,398,707 B2
(45) Date of Patent: Jul. 26, 2022

(54) CALIBRATOR LEAD SET FOR AUTOMATED CALIBRATION

(71) Applicant: Fluke Corporation, Everett, WA (US)

(72) Inventors: William J. Britz, Tulalip, WA (US); Christopher J. Gillette, Jr., Seattle, WA (US); Travis J. Tom, Everett, WA (US)

(73) Assignee: Fluke Corporation, Everett, WA (US)

( * ) Notice: Subject to any disclaimer, the term of this patent is extended or adjusted under 35 U.S.C. 154(b) by 173 days.

(21) Appl. No.: 16/926,576

(22) Filed: Jul. 10, 2020

(65) Prior Publication Data

US 2022/0013970 A1 Jan. 13, 2022

(51) Int. Cl.
*H01R 31/06* (2006.01)
*H01R 13/58* (2006.01)
*G01R 35/00* (2006.01)
*G01R 15/12* (2006.01)

(52) U.S. Cl.
CPC ........... *H01R 31/06* (2013.01); *G01R 15/125* (2013.01); *G01R 35/005* (2013.01); *H01R 13/58* (2013.01); *H01R 2201/20* (2013.01)

(58) Field of Classification Search
CPC .............. G01R 35/005; G01R 15/125; H01R 2201/20; H01R 13/58; H01R 31/06; H01R 9/05
See application file for complete search history.

(56) References Cited

U.S. PATENT DOCUMENTS

| D251,183 | S | * | 2/1979 | Howard | D10/75 |
|---|---|---|---|---|---|
| 6,997,753 | B2 | * | 2/2006 | Broomall | H01R 24/547 |
| | | | | | 439/638 |
| 8,981,765 | B2 | * | 3/2015 | Sano | A61B 5/1125 |
| | | | | | 600/595 |
| 9,618,538 | B2 | * | 4/2017 | Chait | G01R 15/002 |
| 2015/0309077 | A1 | * | 10/2015 | Chait | G01R 15/002 |
| | | | | | 324/555 |

FOREIGN PATENT DOCUMENTS

| CN | 210040648 | U | * | 2/2020 | |
|---|---|---|---|---|---|
| JP | 2019203880 | A | * | 11/2019 | G01R 1/04 |

* cited by examiner

*Primary Examiner* — Briggitte R. Hammond
(74) *Attorney, Agent, or Firm* — Seed Intellectual Property Law Group LLP

(57) ABSTRACT

A calibrator lead set, which electrically couples a first device and a second device during calibration of the second device, includes a cable having multiple wires, a first interface connector coupled to a first end of the wires of the cable, and a plurality of second interface connectors coupled to a second end of the wires that is opposite the first end of the wires. The first interface connector includes a connector retaining portion, multiple connection terminals extending from the connector retaining portion, and a sheath extending from the connector retaining portion and surrounding the connection terminals extending from the connector retaining portion. The sheath may be transparent to facilitate positioning of the connection terminals of the first interface connector. The second interface connectors may include a first sheathed, double banana plug connector and a second sheathed, double banana plug connector stackable on the first sheathed, double banana plug connector.

20 Claims, 10 Drawing Sheets

CALIBRATOR LEAD SET FOR AUTOMATED CALIBRATION

BACKGROUND

Technical Field

The present disclosure relates to calibrating electrical devices, and more particularly to a calibrator lead set for automated calibration of electrical devices.

Description of the Related Art

Current solutions used to calibrate electronic devices, such as digital multimeters (DMMs), for example, have a number of deficiencies. Patch cords that electrically couple a calibration device to a DMM may include single, unsheathed, stackable banana plugs, which can present a safety hazard. For example, if a calibration device is providing a large current through a patch cord and a technician's hand accidentally touches an exposed portion of an electrical connector of the patch cord, the technician could be seriously injured.

Also, current solutions do not use double banana plugs with strain reliefs and protective sheaths. When double banana plugs are not used, the number of plug-ins and amount of technician intervention required while calibrating increases.

In addition, the single banana plugs that are currently used lack clear markings, so it is easy to mix-up the banana plugs and connect them improperly, which can harm the test equipment. It can be particularly difficult for new technicians to perform calibrations using patch cords that include only single banana plugs.

Further, conventional banana plugs do not include strain reliefs, which can cause the patch cords to quickly wear out. For example, if a large number of calibrations are performed, frequent replacement of the patch cords may be necessary, which adds to the cost of performing the calibrations.

Also, patch cords currently used for performing calibration do not use coaxial cables, and consequently measurements made using such patch cords may be more susceptible to noise interference. In particular, patch cords with double banana plugs and coaxial cables for calibration with strain reliefs and protective sheaths are not available.

In addition, input terminals on electronic devices that are being calibrated may be spaced closely together, which can make it difficult for patch cords used in calibration to be connected to those terminals. Moreover, input terminals of handheld DMMs and input terminals of benchtop DMMs may be arranged differently, wherein a calibration device may be capable of being connected to handheld DMMs but not benchtop DMMs, or vice versa.

BRIEF SUMMARY

The present disclosure provides a calibrator lead set that overcomes one or more of the above deficiencies of conventional patch cords. For example, calibrator lead sets according to the present disclosure enable automated calibrations to be conducted more quickly and safely than can be conducted using conventional patch cords, which can minimize technician labor hours for calibrating DMMs and maximize throughput in calibration laboratories. In addition, calibrator lead sets according to the present disclosure enable calibration procedures to be simplified by requiring fewer connection operations by a technician, which can result in more DMMs being calibrated per day than with current solutions. Further, calibrator lead sets according to the present disclosure provide durability features that are not present in current solutions.

A calibrator lead set that electrically couples a first device and a second device during calibration of the second device according to the present disclosure may be summarized as including: a cable including a plurality of wires; a first interface connector coupled to a first end of the wires of the cable; and a plurality of second interface connectors coupled to a second end of the wires that is opposite the first end of the wires. The first interface connector includes: a connector retaining portion; a plurality of connection terminals extending from the connector retaining portion; and a sheath extending from the connector retaining portion and surrounding the connection terminals extending from the connector retaining portion.

The sheath may be transparent. A distance that the sheath extends from the connector retaining portion may be greater than a distance that the connection terminals extend from the connector retaining portion. The first device may perform the calibration on the second device, and the connection terminals of the first interface connector may be configured to mate with a plurality of connection terminals of the first device. The first interface connector may include a handle that extends from the connector retaining portion of the first interface connector, on a side of the connector retaining portion that is opposite a side of the connector retaining portion from which the connection terminals extend. An end of the handle may include a plurality of fins that provide strain relief for the wires. The handle may include a plurality of ridges positioned to contact a thumb of a hand that grasps the handle.

The second interface connectors may include: a first connector having a first connection terminal surrounded by a first sheath, and a second connection terminal surrounded by a second sheath, and a second connector having a third connection terminal surrounded by a third sheath and electrically coupled to a first insert portion, and a fourth connection terminal surrounded by a fourth sheath and electrically coupled to a second insert portion. The first connection terminal and the first sheath of the first connector may be configured to be inserted into the first insert portion of the second connector while the second connection terminal and the second sheath of the first connector are inserted into the second insert portion of the second connector. While the first connection terminal and the first sheath of the first connector are inserted into the first insert portion of the second connector, the first connection terminal of the first connector may be electrically coupled to the third connection terminal of the second connector. While the second connection terminal and the second sheath of the first connector are inserted into the second insert portion of the second connector, the second connection terminal of the first connector may be electrically coupled to the fourth connection terminal of the second connector. The second interface may connectors include: a third connector having a fifth connection terminal surrounded by a fifth sheath, and a fourth connector having a sixth connection terminal surrounded by a sixth sheath. Each of the first connector, the second connector, the third connector, and the fourth connector may include a wire strain relief portion.

Another calibrator lead set that electrically couples a first device and a second device during calibration of the second device according to the present disclosure may be summarized as including: a cable including a plurality of wires; a first interface connector coupled to a first end of the wires of the cable; and a plurality of second interface connectors coupled to a second end of the wires that is opposite the first end of the wires. The second interface connectors include: a first connector having a first connection terminal surrounded by a first sheath, and a second connection terminal surrounded by a second sheath, and a second connector having a third connection terminal surrounded by a third sheath and electrically coupled to a first insert portion, and a fourth connection terminal surrounded by a fourth sheath and electrically coupled to a second insert portion. The first connection terminal and the first sheath of the first connector are configured to be inserted into the first insert portion of the second connector while the second connection terminal and the second sheath of the first connector are inserted into the second insert portion of the second connector. While the first connection terminal and the first sheath of the first connector are inserted into the first insert portion of the second connector, the first connection terminal of the first connector is electrically coupled to the third connection terminal of the second connector. While the second connection terminal and the second sheath of the first connector are inserted into the second insert portion of the second connector, the second connection terminal of the first connector is electrically coupled to the fourth connection terminal of the second connector.

The second interface may connectors include: a third connector having a fifth connection terminal surrounded by a fifth sheath, and a fourth connector having a sixth connection terminal surrounded by a sixth sheath. Each of the first connector, the second connector, the third connector, and the fourth connector may include a wire strain relief portion. The first interface connector may include: a connector retaining portion; a plurality of connection terminals extending from the connector retaining portion; and a sheath extending from the connector retaining portion and surrounding the connection terminals extending from the connector retaining portion. A distance that the sheath extends from the connector retaining portion may be greater than a distance that the connection terminals extend from the connector retaining portion. The sheath may be transparent. The connector retaining portion may include a handle that extends from the connector retaining portion of the first interface connector, on a side of the connector retaining portion that is opposite a side of the connector retaining portion from which the connection terminals extend. An end of the handle may include a plurality of fins that provide strain relief for the wires. The handle may include a plurality of ridges positioned to contact a thumb of a hand that grasps the handle. The first device may perform the calibration on the second device, and the connection terminals may be configured to mate with a plurality of connection terminals of the first device. Two of the wires may be included in a first coaxial cable and two of the wires may be included in a second coaxial cable.

DETAILED DESCRIPTION

According to the present disclosure, a calibrator lead set can be coupled to a calibrator device, such as a model 5560 calibrator available from Fluke Corporation, to perform calibration of a measurement device, such as a model 8808A digital multimeter available from Fluke Corporation. The calibrator lead set provides an easy to use, long lasting, calibration lead solution for laboratory technicians. The calibrator lead set can minimize a number of interactions that a technician has with the calibrator lead set and calibrator when calibrating a digital multimeter. The calibrator lead set works with both handheld and benchtop multimeters, and up to 15 amps and 1000 volts.

More particularly, in at least one embodiment, the calibrator lead set includes four test leads for connecting to a unit under test (UUT) that is being calibrated, and a test block for connecting to a calibrator. The test block plugs into the calibrator, making the correct connections for each test lead without a technician having to think about where each connection terminal is to be coupled. The test leads in this embodiment include two single sheathed banana plugs for high current and low current calibrations, and a set of one non-stackable double banana plug and one stackable double banana plug for measuring 4 W Ohms (benchtop) and 2 W Ohms (handheld) devices.

Figure 1:
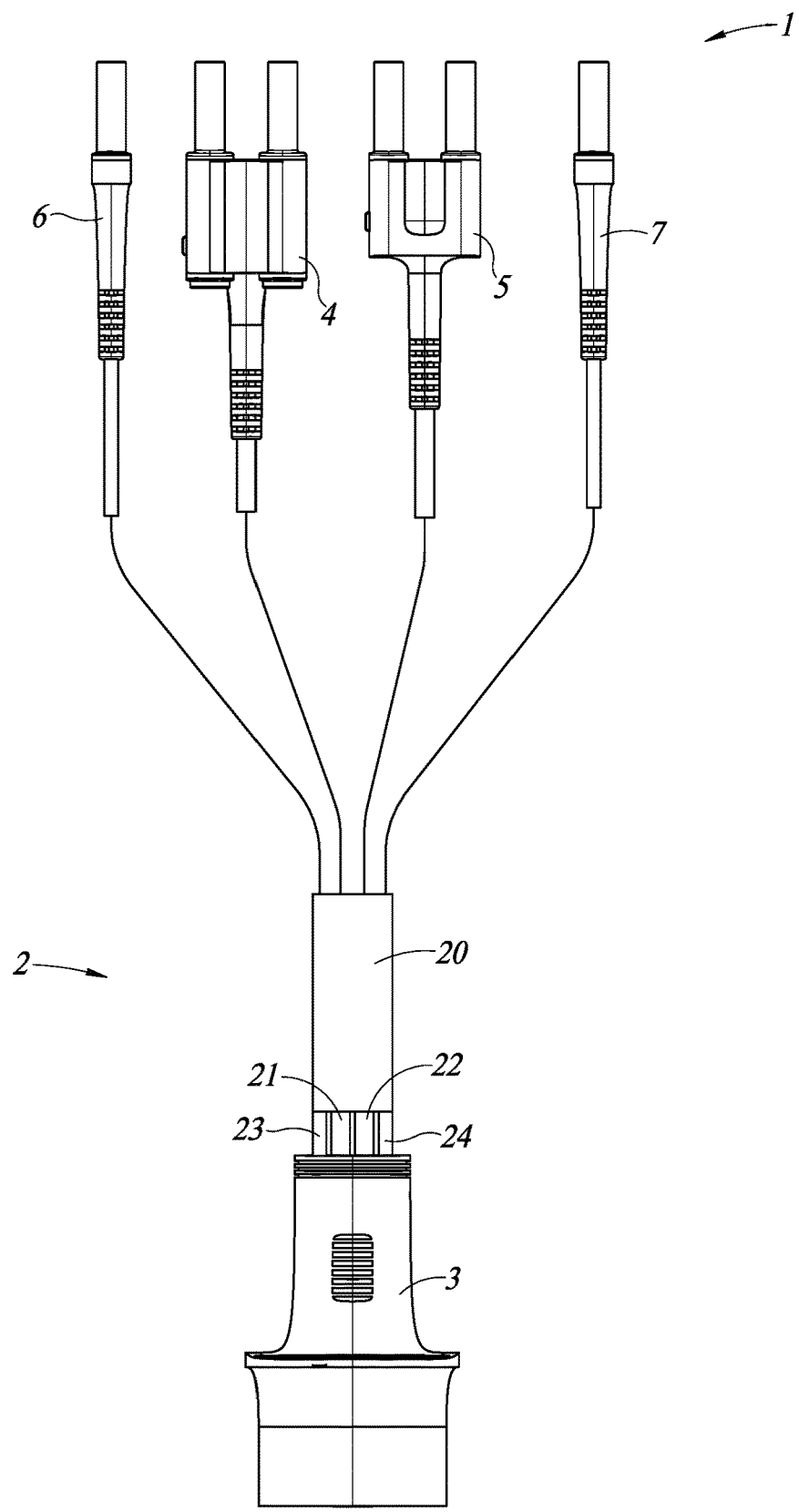
FIG. 1 is a diagram of a calibrator lead set, according to one or more embodiments of the present disclosure.

FIG. 1 is a diagram of a calibrator lead set 1, according to one or more embodiments of the present disclosure. The calibrator lead set 1 includes a cable assembly 2 having a first end to which a first interface connector, namely a cable block connector 3, is coupled, and a second end (opposite to the first end) to which a plurality of second interface connectors, including a first connector, namely a sense connector 4, a second connector, namely an input connector 5, a third connector, namely a high current input connector 6, and a fourth connector, namely a low current input connector 7, are coupled. More particularly, the cable assembly 2 includes a sleeve 20 in which a first coaxial cable 21 (e.g., RG-58C), a second coaxial cable 22 (e.g., RG-58C), a first wire 23 (e.g., silicone-insulated), and a second wire 24 (e.g., silicone-insulated) are disposed. In some embodiments, the first interface connector is a unitary, integrated structure that includes a plurality of connection terminals and a sheath extending therefrom, as described herein.

Figure 2A:
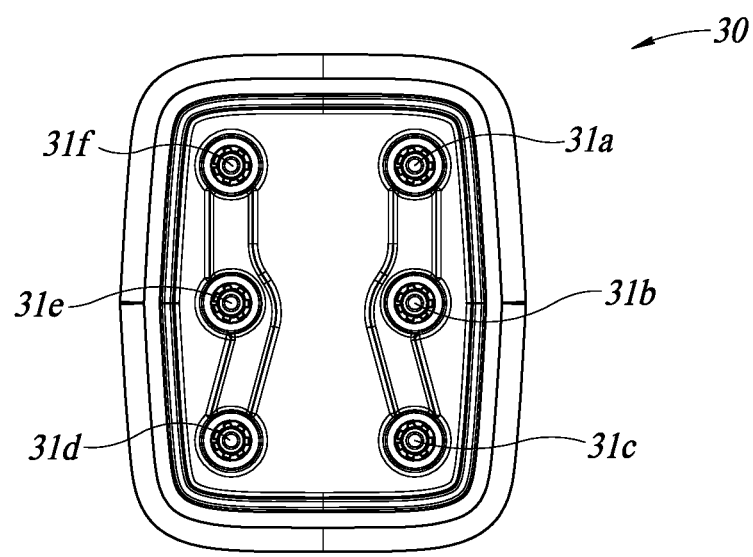
FIGS. 2A-2H are diagrams illustrating the assembly of a cable block connector of the calibrator lead set shown in FIG. 1, according to one or more embodiments of the present disclosure.
Figure 2B:
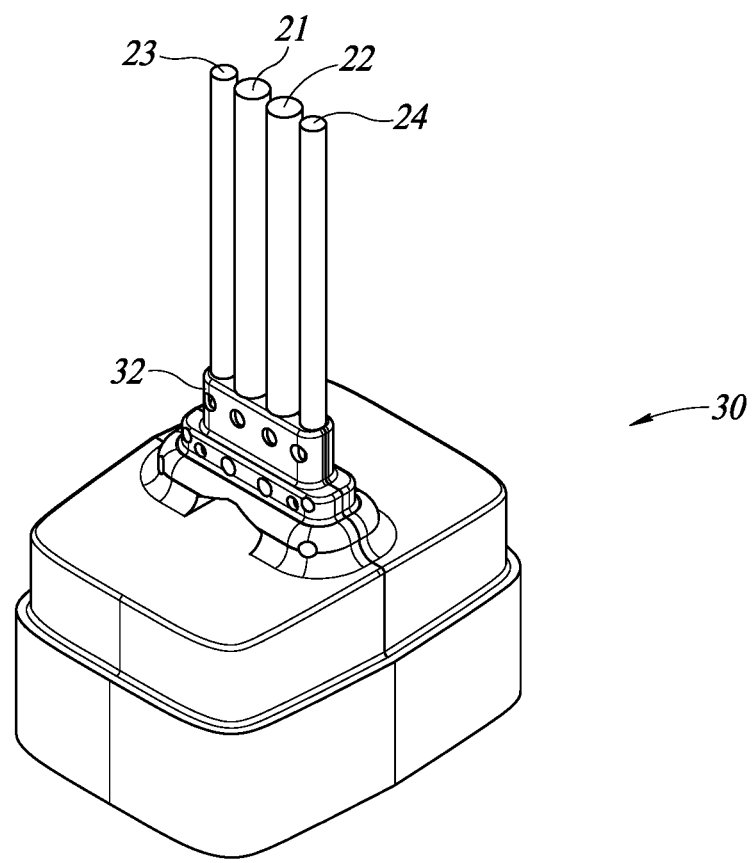

FIGS. 2A-2H are diagrams that illustrate the assembly of the cable block connector 3 of the calibrator lead set 1 shown in FIG. 1, according to one or more embodiments of the present disclosure. More particularly, FIG. 2A shows a bottom view of a pre-mold portion 30 that includes, in this embodiment, six connection terminals 31a to 31f (e.g., banana plug connectors). FIG. 2B is a perspective view of the pre-mold portion 30. First ends of each of the first coaxial cable 21, second coaxial cable 22, first wire 23, and second wire 24 are inserted into apertures formed in the top of the pre-mold portion 30 and connected to one or the other of the six connection terminals 31a to 31f, as will be described below. In addition, a clamp 32 is used to secure the first coaxial cable 21, second coaxial cable 22, first wire 23, and second wire 24 to the pre-mold portion 30.

Figure 2C:
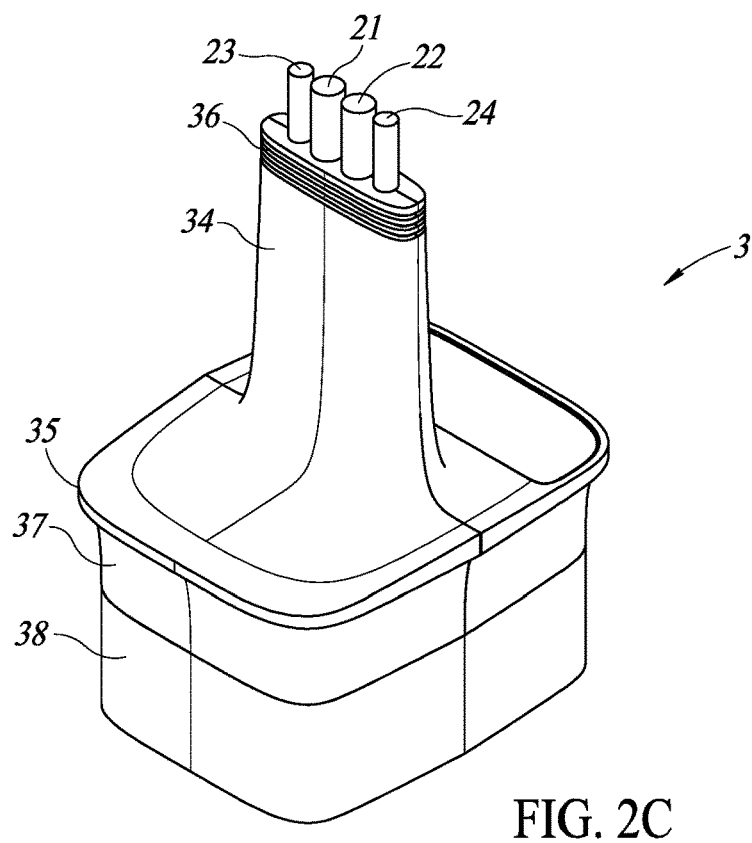

FIG. 2C is a perspective view of the cable block connector 3, which results from performing an over-molding process on the pre-mold portion 30 with the first ends each of the first coaxial cable 21, second coaxial cable 22, first wire 23, and second wire 24 attached thereto, for example, as shown in FIG. 2B. The cable block connector 3 includes a handle 34 that can be used by a technician to grasp the cable block connector 3 when connecting the cable block connector 3 to a calibrator device. A rim 35 formed at a base of the handle 34 extends around a periphery of the cable block connector 3, which the technician can grasp when disconnecting the cable block connector 3 from the calibrator device. A plurality of fins 36 is provided at an end of the handle 34, which provides strain relief for the first coaxial cable 21, second coaxial cable 22, first wire 23, and second wire 24. In addition, the cable block connector 3 includes a connector retaining portion 37 and a sheath 38 that extends around the periphery of the cable block connector 3. In one or more embodiments, the sheath 38 is formed from a transparent, electrically insulating material. As shown in FIG. 2C, the handle 34 extends from the connector retaining portion 37 of the cable block connector 3, on a side of the connector retaining portion 37 that is opposite a side of the connector retaining portion 37 from which the connection terminals 31a to 31f extend.

Figure 2D:
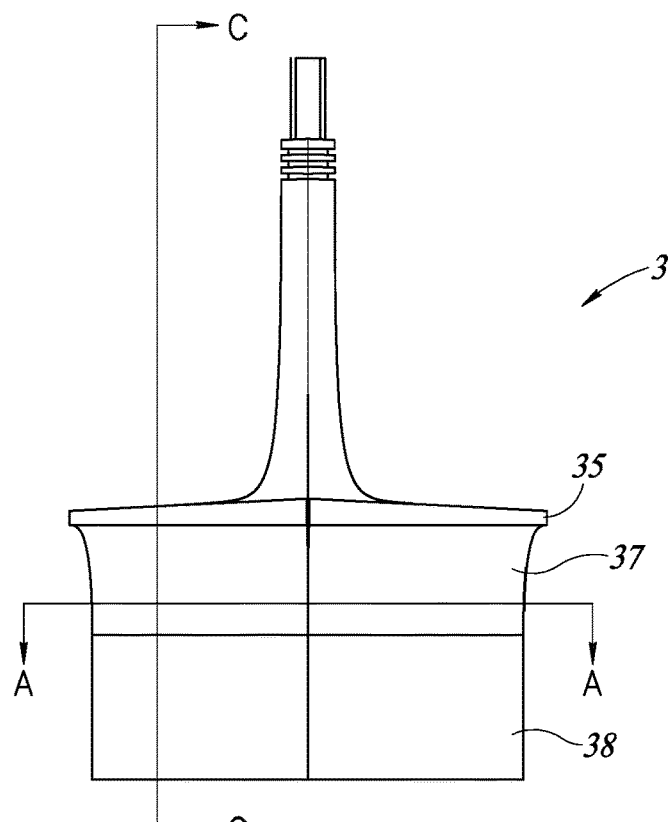

FIG. 2D is a side view of the cable block connector 3. As shown in FIG. 2D, a width of the rim 35 in a first direction (e.g., horizontal direction in FIG. 2D) is greater than a width of the connector retaining portion 37 in the first direction and a width of the sheath 38 in the first direction. Accordingly, when the cable block connector 3 is being disconnected from a calibrator device, a technician can more easily grasp the cable block connector 3 compared to a configuration in which the rim 35 is flush with the connector retaining portion 37 and the sheath 38. In other words, because the rim 35 is wider than the connector retaining portion 37, the rim 35 can prevent the cable block connector 3 from slipping out of a technician's hand when the technician grasps the connector retaining portion 37 and pulls on it.

Figure 2E:
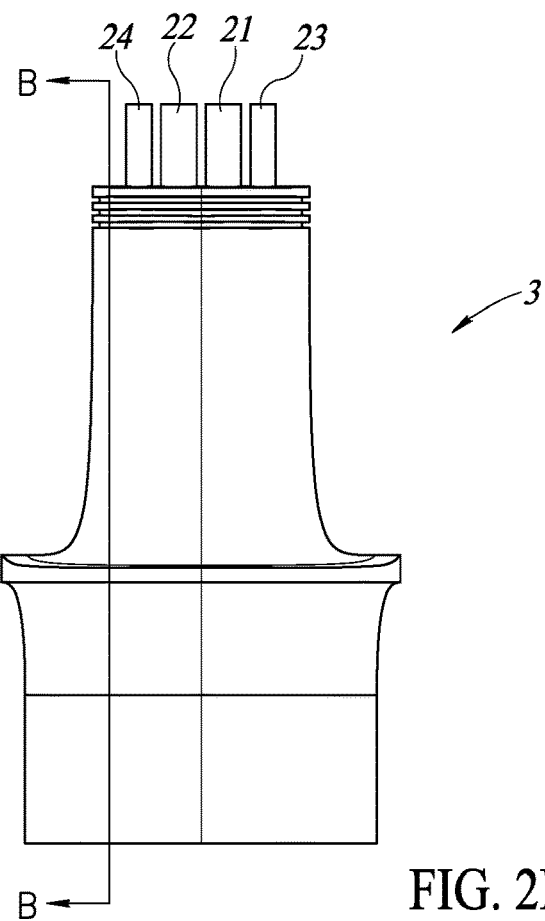
Figure 2F:
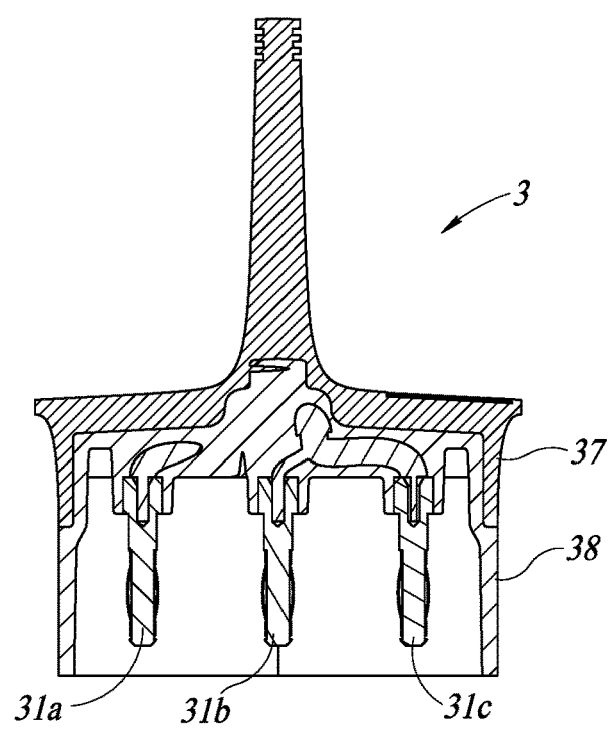

FIG. 2E is a rear view of the cable block connector 3. FIG. 2F is a cross-sectional view of the cable block connector 3 taken along the line B-B in FIG. 2E. As can be seen in FIG. 2F, the ends of the connection terminals 31a, 31b, and 31c are secured in the connector retaining portion 37, which ensures that those connection terminals are secured to the cable block connector 3. For example, the connection terminals 31a to 31f (see FIG. 2A) are coupled (e.g., crimped) to a plurality of electrodes (not labeled in FIG. 2F) to which the first coaxial cable 21, second coaxial cable 22, first wire 23, and second wire 24 are coupled, and that structure is molded to produce the pre-mold portion 30, which is then over-molded to produce the cable block connector 3, as described above.

Additionally, a distance that the sheath 38 extends from the connector retaining portion 37 is greater than a distance that the connection terminals 31a to 31f extend from the connector retaining portion 37. Accordingly, if the distal end of the sheath 38 were to be placed on a metallic surface, for example, the metallic surface would not short together any of the connection terminals 31a to 31f. In addition, the metallic surface would not receive a voltage and/or current output from the connection terminals 31a to 31f, which could prevent a technician from being harmed by the voltage and/or current.

Figure 2G:
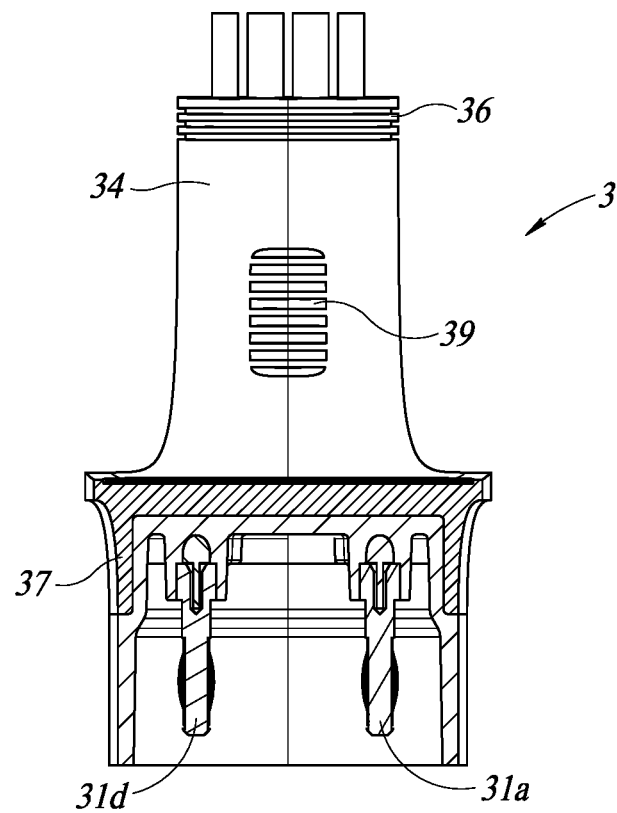

FIG. 2G is a cross-sectional view of the cable block connector 3 taken along the line C-C in FIG. 2D. As can be seen in FIG. 2G, the ends of the connection terminals 31a and 31d are secured in the connector retaining portion 37, which ensures that those connection terminals are secured to the cable block connector 3. Also, the handle 34 includes a plurality of ridges 39 that are positioned such that, when a technician grasps the handle 34, the technician's thumb contacts the ridges 39, which enables the technician to firmly grasp the handle 34 and helps to prevent the handle 34 from slipping out of the technician's hand.

Figure 2H:
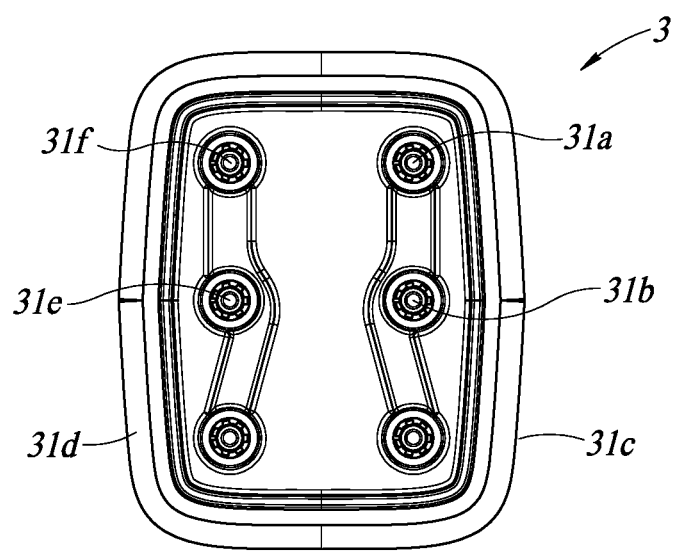

FIG. 2H is a cross-sectional view of the cable block connector 3 taken along the line A-A in FIG. 2D.

Figure 3A:
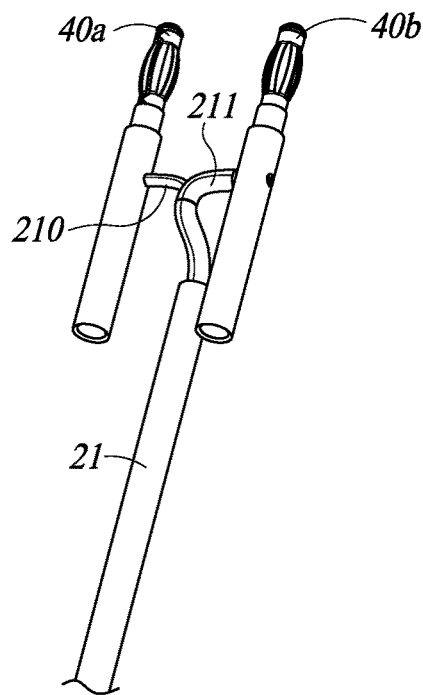
FIGS. 3A-3D are diagrams illustrating the assembly of a sense connector of the calibrator lead set shown in FIG. 1, according to one or more embodiments of the present disclosure.
Figure 3B:
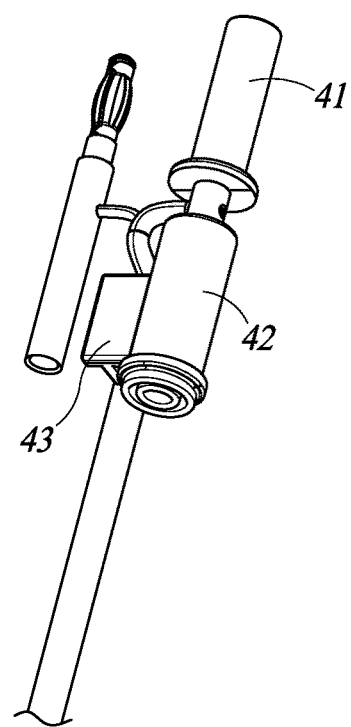
Figure 3C:
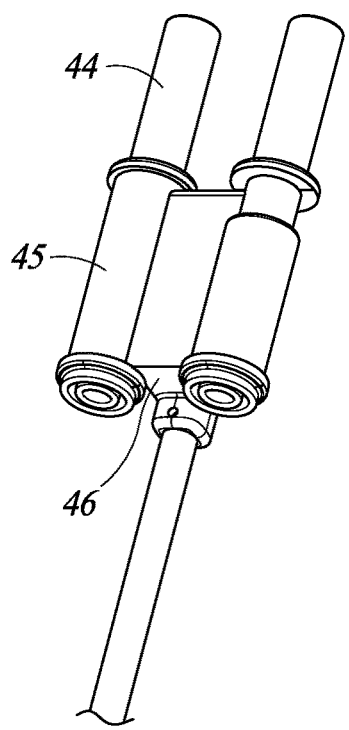
Figure 3D:
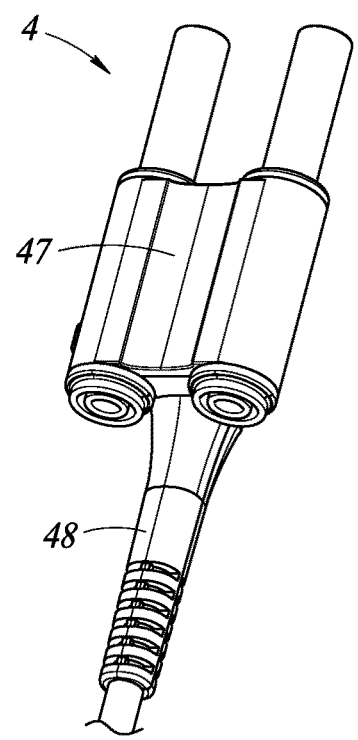

FIGS. 3A-3D are diagrams that illustrate the assembly of the sense connector 4 of the calibrator lead set 1 shown in FIG. 1, according to one or more embodiments of the present disclosure. The sense connector 4 is a stackable, sheathed, double banana connector. The sense connector 4 includes two connection terminals 40a, 40b (e.g., banana plug connectors). The sense connector 4 and the first coaxial cable 21 are placed on a carrier bar (not shown). The first coaxial cable 21 includes two wires 210, 211, wherein a first end of each the wires 210, 211 is electrically coupled (e.g., crimped) to the connection terminals 31d, 31e of the cable block connector 3, respectively, and a second end of each the wires 210, 211 is electrically coupled (e.g., soldered) to the connection terminals 40a, 40b of the sense connector 4, respectively. As shown in FIG. 3B, a first sheath portion 41, a first insert portion 42, and a first structural support portion 43 are added as a result of performing a first molding process on the items shown in FIG. 3A. As shown in FIG. 3C, a second sheath portion 44, a second insert portion 45, and a second structural support portion 46 are added as a result of performing a second molding process on the items shown in FIG. 3B. As shown in FIG. 3D, an over-molding portion 47 including a wire strain relief portion 48, which includes a plurality of fins that provide strain relief to the wires of the first coaxial cable 21, is added as a result of performing an over-molding process on the items shown in FIG. 3C, to complete assembly of the sense connector 4.

Figure 4A:
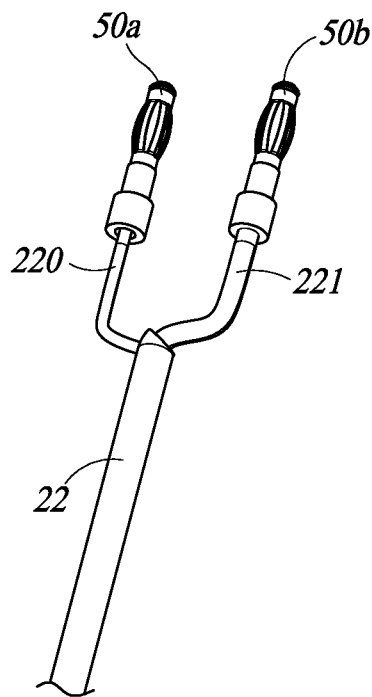
FIGS. 4A-4D are diagrams illustrating the assembly of an input connector of the calibrator lead set shown in FIG. 1, according to one or more embodiments of the present disclosure.
Figure 4B:
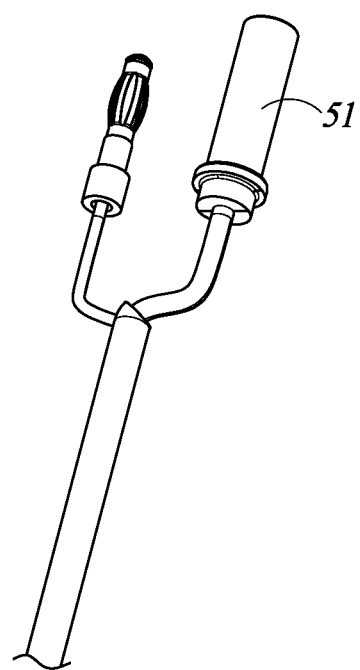
Figure 4C:
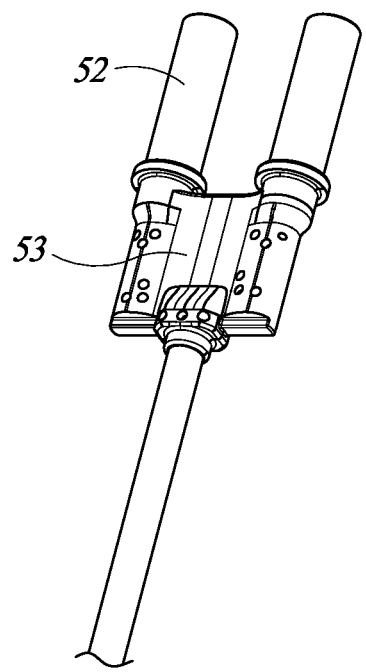
Figure 4D:
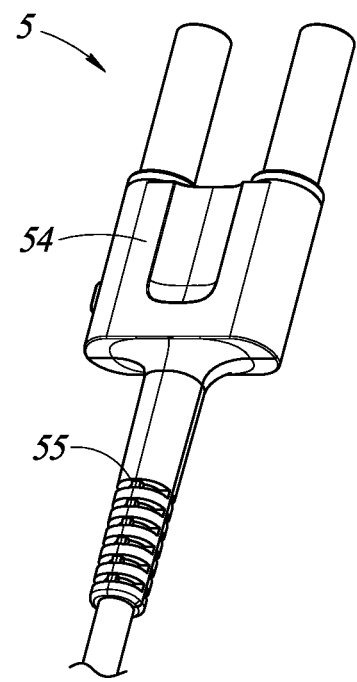

FIGS. 4A-4D are diagrams that illustrate the assembly of the input connector 5 of the calibrator lead set 1 shown in FIG. 1, according to one or more embodiments of the present disclosure. The input connector 5 is a sheathed, double banana connector that can be stacked onto the sense connector 4. The input connector 5 includes two connection terminals 50a, 50b (e.g., banana plug connectors). The input connector 5 and the second coaxial cable 22 are placed on a carrier bar (not shown). The second coaxial cable 22 includes two wires 220, 221, wherein a first end of each the wires 220, 221 is electrically coupled (e.g., soldered) to the connection terminals 31d, 31e of the cable block connector 3, respectively, and a second end of each the wires 220, 221 is electrically coupled (e.g., soldered) to the connection terminals 50a, 50b, respectively. As shown in FIG. 4B, a first sheath portion 51 is added as a result of performing a first molding process on the items shown in FIG. 4A. As shown in FIG. 4C, a second sheath portion 52 and a structural support portion 53 are added. As shown in FIG. 4D, an over-molding portion 54 including a wire strain relief portion 55, which includes a plurality of fins that provide strain relief to the wires of the second coaxial cable 22, is added as a result of performing an over-molding process on the items shown in FIG. 4C, to complete assembly of the input connector 5.

Figures 5, 6:
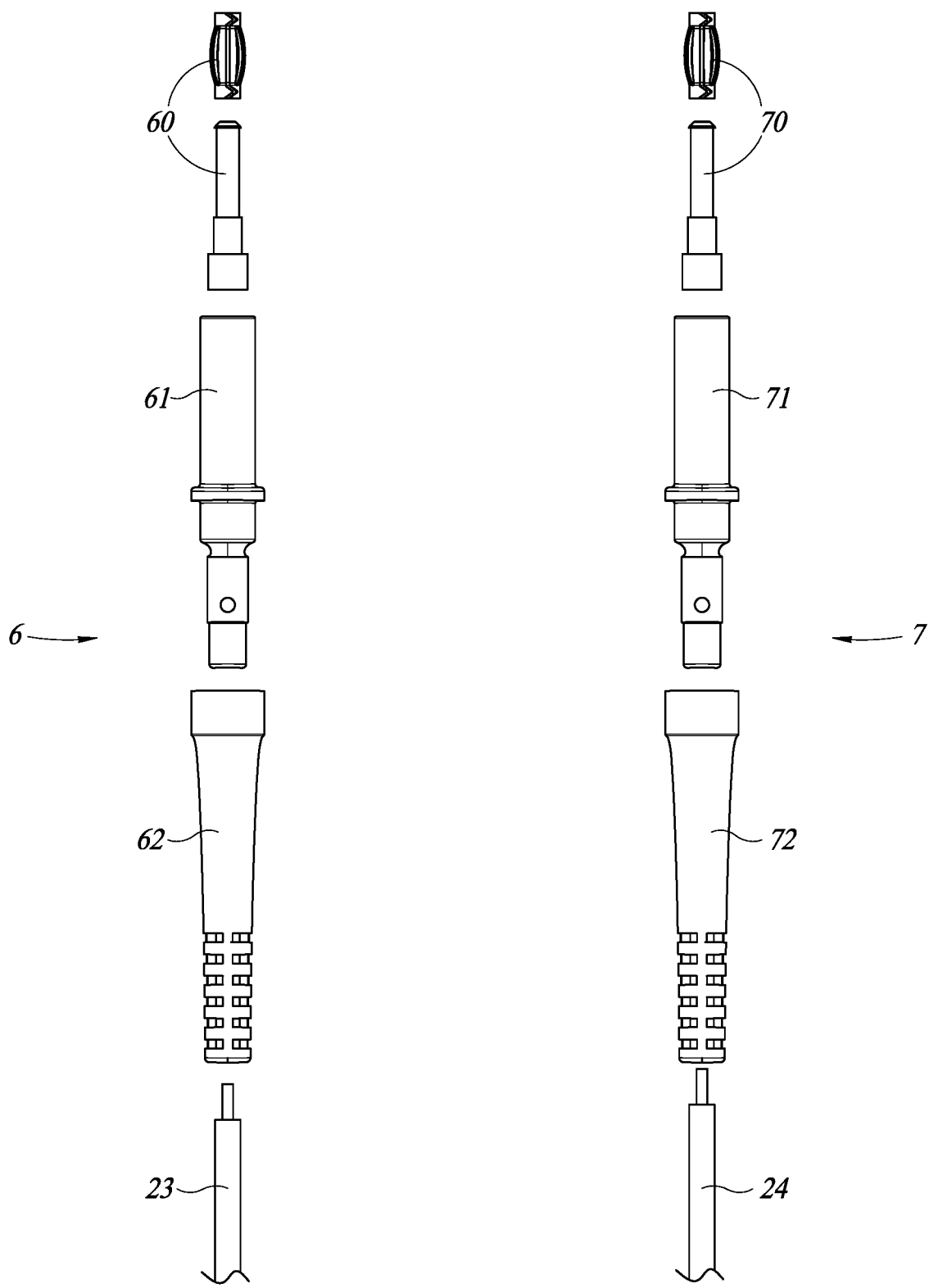
FIG. 5 is a diagram illustrating the assembly of a high current input connector of the calibrator lead set shown in FIG. 1, according to one or more embodiments of the present disclosure.
FIG. 6 is a diagram illustrating the assembly of a low current input connector of the calibrator lead set shown in FIG. 1, according to one or more embodiments of the present disclosure.

FIG. 5 is a diagram that illustrates the assembly of the high current input connector 6 of the calibrator lead set 1 shown in FIG. 1, according to one or more embodiments of the present disclosure. The high current input connector 6 includes a connection terminal 60 (e.g., including a banana plug connector portion and a terminal portion) that is surrounded by an insulating sheath 61, which are shown in exploded view in FIG. 5. A first end of the first wire 23 is electrically coupled (e.g., crimped) to the connection terminal 31f of the cable block connector 3, and a second end of the first wire 23 is inserted into an aperture formed in an insulating handle 62 (e.g., silicone) and then electrically coupled (e.g.) to the connection terminal 60. The handle 62 is then added by performing an over-molding process, to complete assembly of the high current input connector 6. An end of the handle 62 furthest away from the connection terminal 60 includes a plurality of fins that provide strain relief to the first wire 23.

FIG. 6 is a diagram that illustrates the assembly of the low current input connector 7 of the calibrator lead set 1 shown in FIG. 1, according to one or more embodiments of the present disclosure. The low current input connector 7 includes a connection terminal 70 (e.g., including a banana plug connector portion and a terminal portion) that is surrounded by an insulating sheath 71, which are shown in exploded view in FIG. 6. A first end of the second wire 24 is electrically coupled (e.g., crimped) to the connection terminal 31c of the cable block connector 3, and a second end of the second wire 24 is inserted into an aperture formed in an insulating handle 72 (e.g., silicone) and then electrically coupled (e.g., crimped) to the connection terminal 70. The handle 72 is then added by performing an over-molding process, to complete assembly of the low current input connector 7. An end of the handle 72 furthest away from the connection terminal 70 includes a plurality of fins that provide strain relief to the second wire 24.

Figure 7:
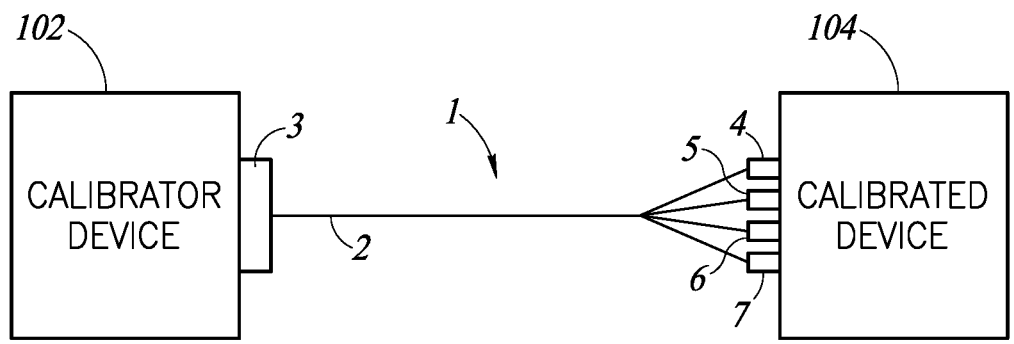
FIG. 7 is a diagram illustrating use of the calibrator lead set shown in FIG. 1, according to one or more embodiments of the present disclosure.

FIG. 7 is a diagram that illustrates use of the calibrator lead set 1 shown in FIG. 1, according to one or more embodiments of the present disclosure. A technician couples the cable block connector 3 to a first device, namely a calibrator device 102, as described in greater detail below in connection with FIG. 8. The technician may also couple the sense connector 4, input connector 5, high current input connector 6, and low current input connector 7 to a second device, namely a device 104 to be calibrated, as described in greater detail below in connection with FIGS. 9A and 9B. After coupling the calibrator device 102 to the device 104 using the calibrator lead set 1, the technician operates a control panel of the calibrator device 102 and/or a computer (not shown) coupled to the calibrator device 102 in order to perform desired calibration testing. The calibrator device 102 provides via the calibrator lead set 1 extremely precise voltages and currents to the device 104, which are measured by the device 104. If a value of a voltage or current measured by the device 104 differs from a corresponding actual value of the voltage or current provided by the calibrator device 102, the device 104 can be adjusted or calibrated such that it produces a measured value that is equal to the actual value of the voltage or current provided by the calibrator device 102.

Figure 8:
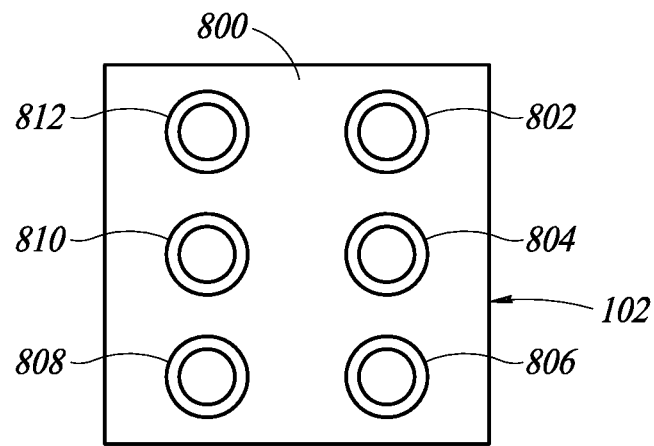
FIG. 8 is a diagram showing connection terminals of a calibrator device to which the cable block connector of the calibrator lead set shown in FIG. 7 can be connected, according to one or more embodiments of the present disclosure.

FIG. 8 is a diagram showing connection terminals of the calibrator device 102 shown in FIG. 7, according to one or more embodiments of the present disclosure. More particularly, the calibrator device 102 includes an interface panel 800 and six banana jack receptacles 802 to 812, wherein the receptacles 802 to 812 are provided in posts that extend outwardly from the interface panel 800 and are perpendicular to the interface panel 800.

In at least one embodiment of the calibrator device 102, the receptacles 802 and 804 are labeled as Auxiliary Output (AUX) terminals and are used for alternating current (AC) and direct current (DC) current outputs, the second voltage output in dual voltage modes, and ohms sense for 2-wire and 4-wire compensated resistance and capacitance measurements, and Resistance Temperature Detector (RTD) simulation. The receptacle 806 of the calibrator device 102 is labeled as a 20 Ampere (A) terminal and is the source of current output when a 20 A range is selected. The receptacle 808 of the calibrator device 102 is labeled as a GUARD terminal and is always connected internally to an internal guard shield (not shown), which shield is tied to a NORMAL LO signal ground inside the calibrator device 102 unless a particular key (not shown) is pressed so that its indicator is lit. The receptacles 810 and 812 of the calibrator device 102 are labeled as Normal Output (NORMAL) terminals and are used for AC and DC voltage, ohms and capacitance sourcing, and Resistance Temperature Detector (RTD) simulation.

When the calibrator device 102 is used to calibrate the device 104, a technician grasps the cable block connector 3 by the handle 34, moves the cable block connector 3 such that the connection terminals 31a to 31f of the cable block connector 3 are aligned with corresponding ones of the receptacles 802 to 812 of the calibrator device 102. The technician then moves the cable block connector 3 toward the calibrator device 102 until the distal end of the sheath 38 contacts the interface panel 800. While the cable block connector 3 is positioned as described above, the connection terminal 31a of the cable block connector 3 is disposed within the receptacle 812 of the calibrator device 102, the connection terminal 31b of the cable block connector 3 is disposed within the receptacle 810 of the calibrator device 102, the connection terminal 31c of the cable block connector 3 is disposed within the receptacle 808 of the calibrator device 102, the connection terminal 31d of the cable block connector 3 is disposed within the receptacle 802 of the calibrator device 102, the connection terminal 31e of the cable block connector 3 is disposed within the receptacle 804 of the calibrator device 102, and the connection terminal 31f of the cable block connector 3 is disposed within the receptacle 806 of the calibrator device 102. That is, the connection terminals 31a to 31e of the cable block connector 3 are configured to mate with receptacles 802 to 812 of the calibrator device 102. When calibration of the device 104 is completed, the technician may grasp the rim 35 of the cable block connector 3, and pull the cable block connector 3 away from the interface panel 800, to disconnect the calibrator lead set 1 from the calibrator device 102.

In at least some embodiments, the sheath 38 is formed from a transparent material. When the sheath 38 is formed from a transparent material, the technician can see the connection terminals 31a to 31f of the cable block connector 3. Thus, the technician can more easily align the connection terminals 31a to 31f of the cable block connector 3 with the receptacles 802 to 812 of the calibrator device 102. In addition, status lights (not shown, e.g., light emitting diodes) may be located on the input panel 800 near the receptacles 802 to 812. When the sheath 38 is formed from a transparent material, the technician is able to view the status lights during calibration.

Figure 9A:
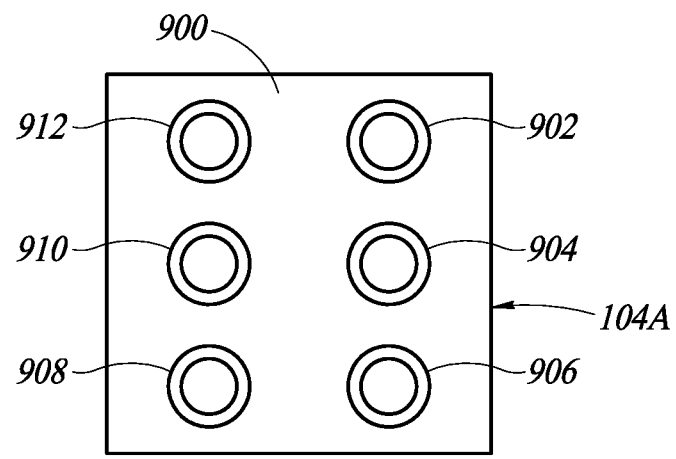
FIGS. 9A and 9B are diagrams showing connection terminals of a benchtop digital multimeter and a handheld digital multimeter, respectively, to which the sense connector, input connector, high current input connector, and low current input connector of the calibrator lead set shown in FIG. 7 can be connected, according to one or more embodiments of the present disclosure.
Figure 9B:
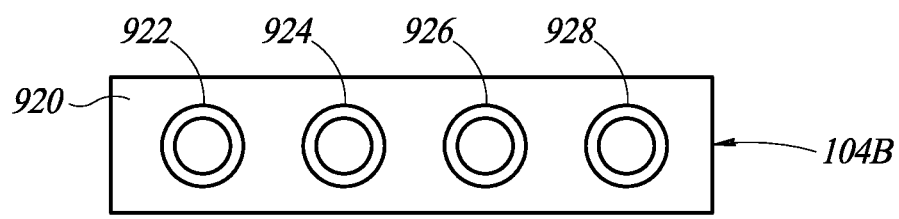

FIGS. 9A and 9B are diagrams showing exemplary embodiments of connection terminals of a benchtop digital multimeter 104A and a handheld digital multimeter 104B, respectively, which may be the device 104 to be calibrated, as shown in FIG. 7. As shown in FIG. 9A, the benchtop digital multimeter 104A includes an input panel 900 and six banana jack receptacles 902 to 912, wherein the receptacles 902 to 912 are provided in posts that are disposed within the benchtop digital multimeter 104A such that top portions of the receptacles 902 to 912 are approximately flush with an outer surface of the input panel 900.

In at least one embodiment, the receptacles 902 and 904 are labeled as SENSE 4 WΩ HI and SENSE 4 WΩ LO receptacles, respectively, and are used as 4-wire Ohms measurement sense connection terminals. The receptacle 906 of the benchtop digital multimeter 104A is labeled as a 10 A receptacle and is used as an input terminal for 10 A AC and DC current measurement. The receptacle 908 of the benchtop digital multimeter 104A is labeled as a milliampere (mA) receptacle and is used as an input terminal for 200 mA AC and DC current measurement. The receptacles 910 and 912 of the benchtop digital multimeter 104A are labeled as INPUT VΩ→⊢⋺⋺}} HI and INPUT VΩ→⊢⋺⋺}} LO receptacles, respectively, and are used as input terminals for Volts, 2-Wire and 4-Wire Ohms, and Hz measurements.

When the calibrator device 102 is used to calibrate the benchtop digital multimeter 104A, a technician plugs the sense connector 4 into the input panel 900 such that the connection terminal 40a of the sense connector 4 is disposed within the receptacle 902 of the benchtop digital multimeter 104A, and the connection terminal 40b of the sense connector 4 is disposed within the receptacle 904 of the benchtop digital multimeter 104A. The technician also plugs the input connector 5 into the input panel 900 such that the connection terminal 50a of the input connector 5 is disposed within the receptacle 912 of the benchtop digital multimeter 104A, and the connection terminal 50b of the input connector 5 is disposed within the receptacle 910 of the benchtop digital multimeter 104A. In addition, the technician plugs the high current input connector 6 into the input panel 900 such that the connection terminal 60 of the high current input connector 6 is disposed within the receptacle 906 of the benchtop digital multimeter 104A. Also, the technician plugs the low current input connector 7 into the input panel 900 such that the connection terminal 70 of the low current input connector 7 is disposed within the receptacle 908 of the benchtop digital multimeter 104A.

As shown in FIG. 9B, the handheld digital multimeter 104B includes an input panel 920 and four banana jack receptacles 922 to 928, wherein the receptacles 922 to 928 are provided in posts that are disposed within the handheld digital multimeter 104B such that top portions of the receptacles 922 to 928 are approximately flush with an outer surface of the input panel 920.

In at least one embodiment, the receptacle 922 of the handheld digital multimeter 104B is labeled A and is used for input for 0 A to 10.00 A current (20VA overload for 30 seconds on, 10 minutes off), frequency, and duty-cycle measurements. The receptacle 924 of the handheld digital multimeter 104B is labeled $$\frac{mA}{\mu A}$$

and is used for input for 0 A to 400 mA current, frequency, and duty cycle measurements. The receptacle 926 of the handheld digital multimeter 104B is labeled COM and is used as a return terminal for all measurements. The receptacle 928 of the handheld digital multimeter 104B is labeled $\frac{\mathsf{I}}{\mathsf{V}\Omega}$ and is used as an input for voltage, continuity, resistance, diode test, conductance, capacitance, frequency, temperature, period, and duty cycle measurements.

When the calibrator device 102 is used to calibrate the handheld digital multimeter 104B, a technician plugs the sense connector 4 into the input panel 920 such that the connection terminal 40a of the sense connector 4 is disposed within the receptacle 926 of the handheld digital multimeter 104B, and the connection terminal 40b of the sense connector 4 is disposed within the receptacle 928 of the handheld digital multimeter 104B. The technician also stacks the input connector 5 onto the sense connector 4 such that the connection terminal 50a of the input connector 5 is inserted into the second insert portion 45 of the sense connector 4 and the connection terminal 50b of the input connector 5 is inserted into the first insert portion 42 of the sense connector 4. While the connection terminal 50a of the input connector 5 is inserted into the second insert portion 45 of the sense connector 4 and the connection terminal 50b of the input connector 5 is inserted into the first insert portion 42 of the sense connector 4, the connection terminal 50a of the input connector 5 is electrically coupled to the connection terminal 40a of the sense connector 4 and the connection terminal 50b of the input connector 5 is electrically coupled to the connection terminal 40b of the sense connector 4. Notably, because the strain relief portion 48 of the sense connector 4 is provided at a side of the sense connector 4, and the strain relief portion 55 of the input connector 5 is provided at the back of the input connector 5 (e.g., between the connection terminal 50a and 50b), the input connector 5 can be stacked onto the sense connector 4. In other words, the novel arrangement of the strain relief portion 48 of the sense connector 4 and the strain relief portion 55 of the input connector 5 enables the input connector 5 to be stacked onto the sense connector 4. It is noted that the calibrator device 102 could not be coupled to the handheld digital multimeter 104B using conventional double banana plugs, which cannot be stacked.

In addition, the technician plugs the high current input connector 6 into the input panel 920 such that the connection terminal 60 of the high current input connector 6 is disposed within the receptacle 922 of the handheld digital multimeter 104B. Also, the technician plugs the low current input connector 7 into the input panel 920 such that the connection terminal 70 of the low current input connector 7 is disposed within the receptacle 922 of the handheld digital multimeter 104B.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A calibrator lead set that electrically couples a first device and a second device during a calibration of the second device, the calibrator lead set comprising:
    a cable including a plurality of wires;
    a first interface connector coupled to a first end of the plurality of wires of the cable; and
    a plurality of second interface connectors coupled to a second end of the plurality of wires that is opposite the first end of the plurality of wires,
    wherein the first interface connector includes:
        a connector retaining portion;
        a plurality of connection terminals extending from the connector retaining portion; and
        a sheath extending from the connector retaining portion and surrounding the plurality of connection terminals extending from the connector retaining portion.

2. The calibrator lead set according to claim 1, wherein the sheath is transparent.

3. The calibrator lead set according to claim 1, wherein a distance that the sheath extends from the connector retaining portion is greater than a distance that the plurality of connection terminals extend from the connector retaining portion.

4. The calibrator lead set according to claim 1, wherein the first device is configured to calibrate the second device, and the plurality of connection terminals of the first interface connector are configured to mate with a plurality of connection terminals of the first device.

5. The calibrator lead set according to claim 1, wherein the first interface connector includes a handle that extends from the connector retaining portion of the first interface connector, on a side of the connector retaining portion that is opposite a side of the connector retaining portion from which the plurality of connection terminals extend.

6. The calibrator lead set according to claim 5, wherein an end of the handle includes a plurality of fins that provide strain relief for the plurality of wires.

7. The calibrator lead set according to claim 5, wherein the handle includes a plurality of ridges positioned to contact a thumb of a hand that grasps the handle.

8. The calibrator lead set according to claim 1,
    wherein the plurality of second interface connectors include:
        a first connector having a first connection terminal surrounded by a first sheath, and a second connection terminal surrounded by a second sheath, and
        a second connector having a third connection terminal surrounded by a third sheath and electrically coupled to a first insert portion, and a fourth connection terminal surrounded by a fourth sheath and electrically coupled to a second insert portion,
    wherein the first connection terminal and the first sheath of the first connector are configured to be inserted into the first insert portion of the second connector while the second connection terminal and the second sheath of the first connector are inserted into the second insert portion of the second connector,
    wherein, while the first connection terminal and the first sheath of the first connector are inserted into the first insert portion of the second connector, the first connection terminal of the first connector is electrically coupled to the third connection terminal of the second connector, and
    wherein, while the second connection terminal and the second sheath of the first connector are inserted into the second insert portion of the second connector, the second connection terminal of the first connector is electrically coupled to the fourth connection terminal of the second connector.

9. The calibrator lead set according to claim 8, wherein the plurality of second interface connectors include:
    a third connector having a fifth connection terminal surrounded by a fifth sheath, and
    a fourth connector having a sixth connection terminal surrounded by a sixth sheath.

10. The calibrator lead set according to claim 9, wherein each of the first connector, the second connector, the third connector, and the fourth connector includes a wire strain relief portion.

11. A calibrator lead set that electrically couples a first device and a second device during a calibration of the second device, the calibrator lead set comprising:
    a cable including a plurality of wires;
    a first interface connector coupled to a first end of the plurality of wires of the cable; and
    a plurality of second interface connectors coupled to a second end of the plurality of wires that is opposite the first end of the plurality of wires,
    wherein the plurality of second interface connectors include:
        a first connector having a first connection terminal surrounded by a first sheath, and a second connection terminal surrounded by a second sheath, and
        a second connector having a third connection terminal surrounded by a third sheath and electrically coupled to a first insert portion, and a fourth connection terminal surrounded by a fourth sheath and electrically coupled to a second insert portion,
    wherein the first connection terminal and the first sheath of the first connector are configured to be inserted into the first insert portion of the second connector while the second connection terminal and the second sheath of the first connector are inserted into the second insert portion of the second connector,
    wherein, while the first connection terminal and the first sheath of the first connector are inserted into the first insert portion of the second connector, the first connection terminal of the first connector is electrically coupled to the third connection terminal of the second connector, and
    wherein, while the second connection terminal and the second sheath of the first connector are inserted into the second insert portion of the second connector, the second connection terminal of the first connector is electrically coupled to the fourth connection terminal of the second connector.

12. The calibrator lead set according to claim 11, wherein the plurality of second interface connectors include:
    a third connector having a fifth connection terminal surrounded by a fifth sheath, and
    a fourth connector having a sixth connection terminal surrounded by a sixth sheath.

13. The calibrator lead set according to claim 12, wherein each of the first connector, the second connector, the third connector, and the fourth connector includes a wire strain relief portion.

14. The calibrator lead set according to claim 11,
wherein the first interface connector includes:
  a connector retaining portion;
  a plurality of connection terminals extending from the connector retaining portion; and
  a sheath extending from the connector retaining portion and surrounding the plurality of connection terminals extending from the connector retaining portion, and
wherein a distance that the sheath extends from the connector retaining portion is greater than a distance that the plurality of connection terminals extend from the connector retaining portion.

15. The calibrator lead set according to claim 14, wherein the sheath is transparent.

16. The calibrator lead set according to claim 14, wherein the connector retaining portion includes a handle that extends from the connector retaining portion of the first interface connector, on a side of the connector retaining portion that is opposite a side of the connector retaining portion from which the plurality of connection terminals extend.

17. The calibrator lead set according to claim 16,
wherein an end of the handle includes a plurality of fins that provide strain relief for the plurality of wires.

18. The calibrator lead set according to claim 16,
wherein the handle includes a plurality of ridges positioned to contact a thumb of a hand that grasps the handle.

19. The calibrator lead set according to claim 14, wherein the first device is configured to calibrate the second device, and the plurality of connection terminals are configured to mate with a plurality of connection terminals of the first device.

20. The calibrator lead set according to claim 11, wherein two of the plurality of wires are included in a first coaxial cable and two of the plurality of wires are included in a second coaxial cable.

* * * * *